United States Patent
Cheng et al.

(10) Patent No.: US 9,978,648 B2
(45) Date of Patent: May 22, 2018

(54) MANUFACTURING METHOD OF SEMICONDUCTOR DEVICE WITH REGROWN UNDOPED CHANNEL AND REGROWN S/D REGIONS

(71) Applicant: TAIWAN SEMICONDUCTOR MANUFACTURING COMPANY LTD., Hsinchu (TW)

(72) Inventors: Tung-Wen Cheng, New Taipei (TW); Chang-Yin Chen, Taipei (TW); Che-Cheng Chang, New Taipei (TW); Mu-Tsang Lin, Changhua County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days. days.

(21) Appl. No.: 15/480,797

(22) Filed: Apr. 6, 2017

(65) Prior Publication Data

US 2017/0213769 A1    Jul. 27, 2017

Related U.S. Application Data

(62) Division of application No. 14/458,495, filed on Aug. 13, 2014, now Pat. No. 9,627,512.

(51) Int. Cl.
*H01L 21/8238* (2006.01)
*H01L 29/66* (2006.01)
*H01L 29/06* (2006.01)

(52) U.S. Cl.
CPC ........... *H01L 21/823807* (2013.01); *H01L 21/823842* (2013.01); *H01L 29/0649* (2013.01); *H01L 29/66545* (2013.01); *H01L 29/66651* (2013.01)

(58) Field of Classification Search
CPC ............... H01L 21/823807; H01L 29/66651
See application file for complete search history.

(56) References Cited

U.S. PATENT DOCUMENTS

2008/0099794 A1* 5/2008 Beyer ............ H01L 21/823807
257/255
2013/0175585 A1* 7/2013 Tan ................... H01L 29/66628
257/288

* cited by examiner

*Primary Examiner* — Asok K Sarkar
*Assistant Examiner* — Grant Withers
(74) *Attorney, Agent, or Firm* — WPAT, P.C., Intellectual Property Attorneys; Anthony King

(57) ABSTRACT

Some embodiments of the present disclosure provide a semiconductor structure, including a substrate having a top surface; a first doped region in proximity to the top surface; a non-doped region positioned in proximity to the top surface and adjacent to the first doped region, having a first width; a metal gate positioned over the non-doped region and over a portion of the first doped region, having a second width. The first width is smaller than the second width, and material constituting the non-doped region is different from material constituting the substrate.

20 Claims, 15 Drawing Sheets

MANUFACTURING METHOD OF SEMICONDUCTOR DEVICE WITH REGROWN UNDOPED CHANNEL AND REGROWN S/D REGIONS

CROSS REFERENCE TO RELATED APPLICATIONS

This application claims the benefit of prior-filed application Ser. No. 14/458,495, filed Aug. 13, 2014, under 35 U.S.C. 120.

BACKGROUND

In order to increase the performance and integration level of integrated circuit chips, the feature size of devices are continuously reducing according to the Moore's Law, and has now been reduced to a nanometer scale. With the reduction in the device volume, the power consumption and leak current has become the biggest concern, and a series of effects that could be ignored in the MOSFET long channel model become more and more notable and even become dominant factors affecting the performance. Such phenomena are collectively called the short channel effect. The short channel effect may cause the degradation of the electrical properties of the device, for example, a drop in the gate threshold voltage, an increase in power consumption and a reduction in signal-to-noise ratio, etc.

Such short-channel effects include, but art not limited to, drain-induced barrier lowering (DIBL) and saturation threshold voltage (Vtsat) roll-off. Specifically, DIBL refers to the fact that in a FET with a relatively short channel length the potential barrier that exists between the drain region and the source region is reduced by the electrostatic influence of the drain voltage. Vtsat roll-off refers to the fact that the relationship between channel length and the Vtsat is curved with significant Vtsat roll-off at smaller channel lengths. DIBL and Vtsat roll-off can both result in an increased off-state leakage current between the source and drain regions. Thus, there is a need in the art for a FET structure that allows for device scaling with minimal DIBL and Vtsat roll-off.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
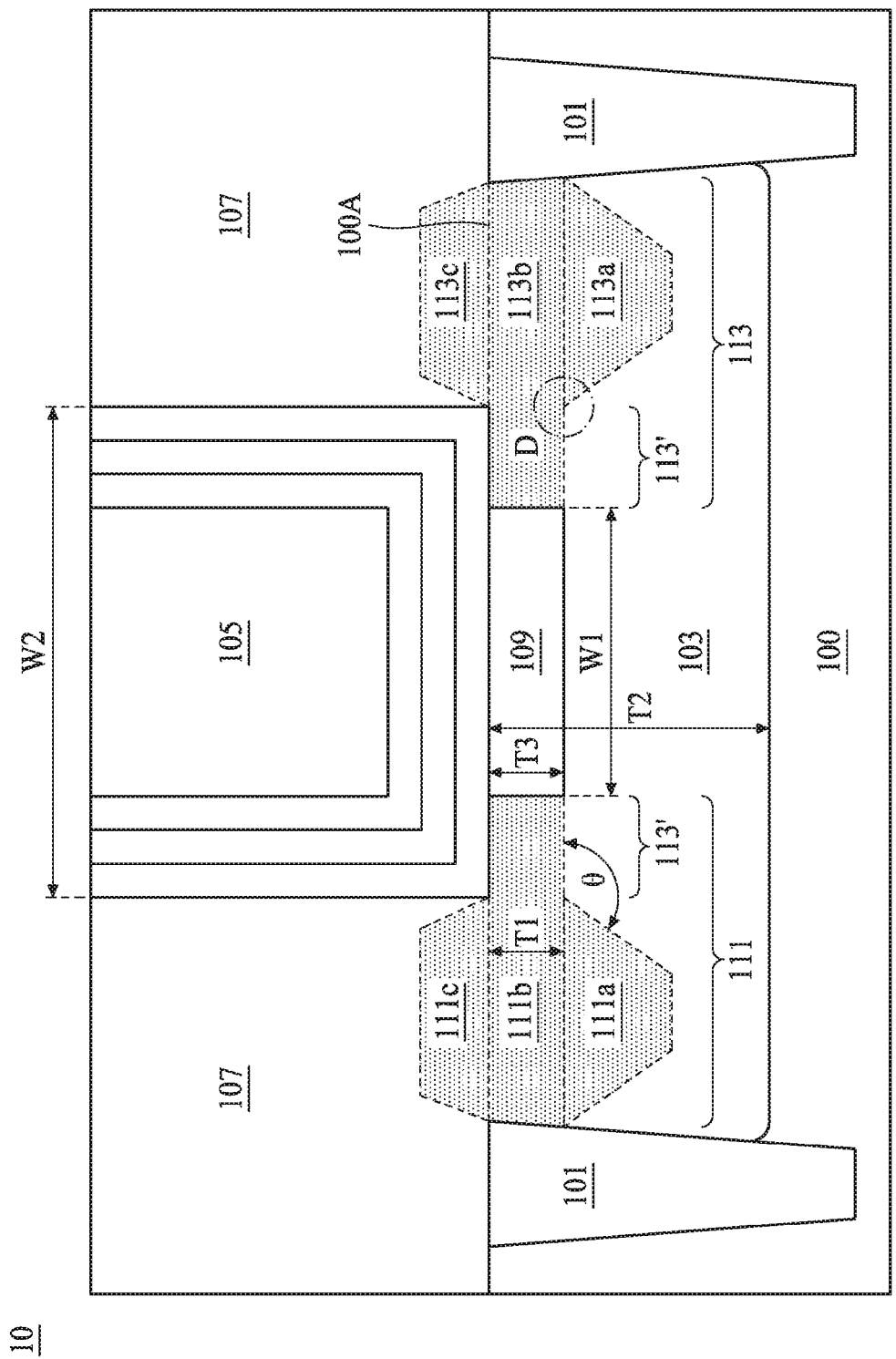
FIG. 1 is a cross sectional view of a semiconductor structure, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In an FET manufacturing scheme where a well implantation operation is performed before the formation of a gate structure, a channel region under the subsequently-formed gate structure is doped with impurities. Impurities serve as scattering centers as far as the carrier transportation is concerned. Carrier mobility in the channel region can be reduced due to the occurrence of the scattering event. Along with the decrease of carrier mobility comes with serious short channel effect, higher off-state current, and greater variation of with-in-wafer (WiW) device performance.

Present disclosure provides a semiconductor structure, a transistor structure, and a method to eliminate scattering center in the channel region by replacing a surface layer of a doped semiconductor substrate with an epitaxial regrown layer. In some embodiments of the present disclosure, a dopant-free channel region having a top surface coplanar with a top surface of the semiconductor substrate is provided. The "channel region" referred herein is not limited to the region where charge carriers actually travels, but including other regions underneath the gate structure. For example, the channel region in some embodiments of the present disclosure may possess a defined width and thickness underneath a bottom of a metal gate.

In some embodiments of the present disclosure, an epitaxially regrown layer is formed in a recess in proximity to a surface of a doped semiconductor substrate. For example, the recess is formed after a well implantation operation, and a surface layer of the well is removed to form the recess. Subsequently, a dummy gate is formed over the regrown layer, serving as a hardmask for a removal operation of a source and drain region abutting the corner of the dummy gate. An epitaxially grown source and drain region is formed to have a funnel portion, a belt portion, and a raised portion, from bottom to top. A dielectric layer is then formed to surround the dummy gate, and a replacement operation is performed to substitute a dummy gate for a metal gate.

The channel region provided in the present disclosure is epitaxially regrown and is dopant-free, hence less scattering centers are positioned in the path where carriers may travel.

Greater carrier mobility, less short channel effect, lowered off-state current, and better WiW device performance can be achieved.

Referring to FIG. 1, a semiconductor structure 10 having a metal gate structure and raised source/drain regions are illustrated according to some embodiments of the present disclosure. In FIG. 1, a substrate 100 is provided, including a crystalline silicon substrate (e.g., wafer). In some alternative embodiments, the substrate 100 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. Further, the substrate 100 may include an epitaxial layer (epi-layer), may be strained for performance enhancement, and/or may include a silicon-on-insulator (SOI) structure.

In the depicted embodiment in FIG. 1, the substrate 100 includes isolation region 101 separating and surrounding an active region. The active regions may include various doping configurations depending on design requirements. For example, if the depicted embodiment has a P-active region, the active region is doped with n-type dopants, such as phosphorus or arsenic; if the depicted embodiment has an N-active region, the active region is doped with p-type dopants, such as boron or $BF_2$. In some embodiments, the active region shown in FIG. 1 includes various structure formed in an n-type well 103. Alternatively, the active region shown in FIG. 1 includes various structure formed in a p-type well 103.

The isolation regions 101 may be formed in the substrate 100 to isolate the various active regions from each other (not shown in FIG. 1). The isolation regions 101 may utilize isolation technology, such as local oxidation of silicon (LOCOS) or shallow trench isolation (STI), to define and electrically isolate the various active regions. In the present embodiment, the isolation region 101 includes an STI. The isolation regions 101 may comprise materials such as silicon oxide, silicon nitride, silicon oxynitride, fluoride-doped silicate glass (FSG), a low-k dielectric material, and/or combinations thereof. The isolation regions 101, and in the present embodiment, the STI, may be formed by any suitable process. As one example, the formation of the STI may include patterning the semiconductor substrate 100 by a conventional photolithography process, etching a trench in the substrate 100 (for example, by using a dry etching, wet etching, and/or plasma etching process), and filling the trench (for example, by using a chemical vapor deposition process) with a dielectric material. In some embodiments, the filled trench may have a multi-layer structure such as a thermal oxide liner layer filled with silicon nitride or silicon oxide. In some embodiments, a chemical mechanical polishing (CMP) process and/or a cleaning process may be performed on the dielectric material.

As shown in FIG. 1, the substrate 100 possesses a top surface 100A. In some embodiments, the top surface 100A is defined as a surface coplanar with a top surface of the isolation regions 101 and a top surface of the non-doped region 109. A first doped region 111 and 113 can be of a same conductive type. A non-doped region 109 is positioned adjacent to the first doped region 111 and 113. As shown in FIG. 1, the first doped region 111 and 113 possess a raised feature, wherein a portion of the first doped region is above the top surface 100A of the substrate 100, and a portion of the first doped region is under the top surface 100A of the substrate 100. In some embodiments, the first doped region 111 and 113 includes a funnel portion (111a, 113a), a belt portion (111b, 113b), and a raised portion (111c, 113c). A first width w1 of the non-doped region 109 is defined by two ends of the non-doped region 109 abutting the belt portion (111b, 113b) of the first doped region 111 and 113. In some embodiments, the first doped region 111 and 113 includes a source and a drain, or collectively called a conductive region. The well 103 discussed herein can be alternatively referred to as a second doped region, opposing to the first doped region 111 and 113. The first doped region and the second doped region 103 can be made of dopants with opposite conducive types.

Referring to FIG. 1, a gate structure, for example, a metal gate 105 is positioned over the non-doped region 109, and over a portion the first doped region 111 and 113. In some embodiments, a second width w2 of the metal gate may or may not include a sidewall spacer of the metal gate 105. Alternatively, the second width w2 can be defined by two sidewalls of the metal gate abutting the raised portion (111c, 113c) of the first doped region 111 and 113. An interlayer dielectric (ILD) layer 107 is surrounding the metal gate 105. The ILD layer 107 may include an oxide formed by a high-aspect-ratio operation and/or a high-density-plasma deposition operation, covering the top surface 100A of the substrate 100. As shown in FIG. 1, the second width w2 of the metal gate is greater than the first width w1 of the non-doped region. In some embodiments, the non-doped region is composed of materials different from that in the substrate 100, that is, the non-doped region 109 may be composed of materials different from silicon (if the substrate is made of silicon). Although the well 103 may be doped with suitable dopant type with suitable concentration distribution profiles according to different design, the well 103 and the substrate 100 are made of substantially identical materials. However, the non-doped region is constructed with different body of materials compared to the well 103 and the substrate 100. However, the materials between the non-doped region 109 and the substrate 100 in the present disclosure are not limited thereto. In other embodiments, the on-doped region 109 and the substrate 100 (including the well 103) are made of identical materials (such as silicon) but with different doping concentrations. Noted the dopant concentration in the well 103 can be of various distributions, but the dopant concentration in the non-doped region is essentially zero.

In some embodiments, the non-doped region 109 is an epitaxially regrown region formed after an implantation operation of the well 103. In other embodiments, the non-doped region 109 and the first doped region 111 and 113 are all epitaxially regrown region forming at different operations.

Referring to FIG. 1, a thickness T3 of the non-doped region 109 can be identified due to different compositions between the non-doped region 109 and the substrate 100. In addition, a thickness T2 of the well 103 can also be identified due to different doping concentrations between the original substrate 100 and the well 103. In some embodiments, the thickness T2 is about 10 to 20 times of the thickness T1. Referring again to FIG. 1, a thickness T1 of the belt portion (111b, 113b) of the first doped region 111 and 113 or collectively conductive region is substantially identical to the thickness T3 of the non-doped region 109. A belt portion (111b, 113b) of the first doped region 111 and 113 includes a plateau region 113' embedded under the top surface 100A. The plateau region 113' refers to a band-like region having a flat bottom, extruding toward the non-doped region 109. In some embodiments, the thickness T3 of the non-doped region 109 is in a range of from about 5 nm to about 50 nm. In other embodiments, the thickness T3 of the non-doped region 109 is in a range of from about 5 nm to about 30 nm. In some embodiments, the thickness T2 of the well 103 can be in a range of from about 50 nm to about 300 nm. However, thickness T2 is at least 10 times greater than thickness T3.

As shown in FIG. 1, the plateau region 113' represents the end of the belt portion (111b, 113b) abutting the non-doped region 109. In some embodiments, an abrupt deflection D can be observed at the joint of the plateau region 113', the rest of the belt portion (111b, 113b), and the funnel portion (111a, 113a). In addition, an angle θ greater than 90 degrees is enclosed by a bottom of the plateau region 113' and an inclined sidewall of the funnel portion (111a, 113a).

The non-doped region 109 discussed in the present disclosure includes materials Si, SiC, SiN, SiON, SiGe, SiP, or the combinations thereof. Note the non-doped region 109 can be made of the same of different materials from the substrate 100. Referring to FIG. 1, in some embodiments, the semiconductor structure 10 has a channel length of less than 20 nm, and the thickness T3 of the non-doped region 109 is approximately identical to the width W1 of the non-doped region 109. The "approximately identical" appeared in the present disclosure refers to a plus/minus 10% of two different values.

Figure 2:
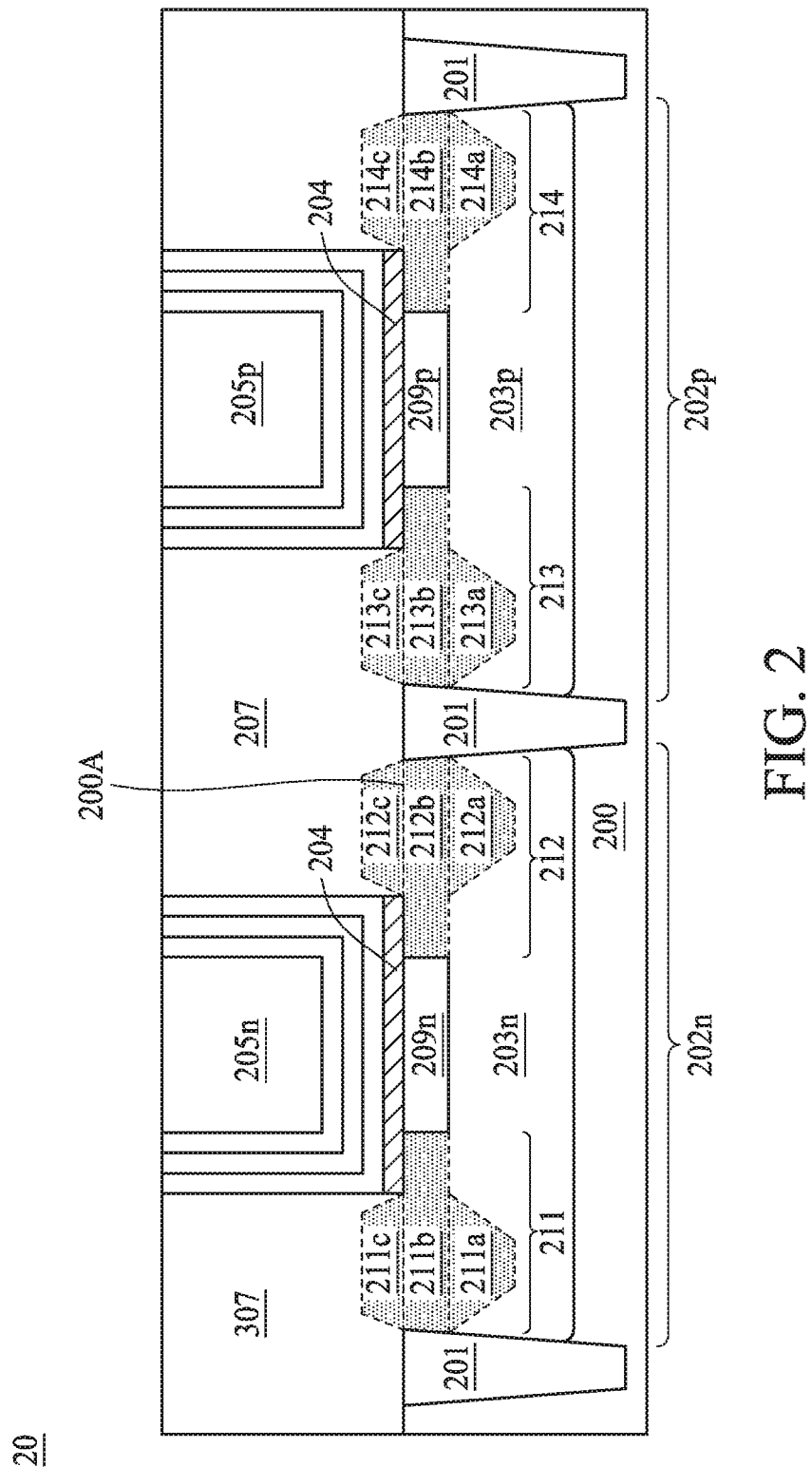
FIG. 2 is a cross sectional view of a semiconductor structure, in accordance with some embodiments of the present disclosure.

Referring to FIG. 2, a complementary metal oxide semiconductor (CMOS) device 20 includes an N-type field effect transistor (NFET) 202n and a P-type FET (PFET) 202p, although just NFETs or PFETs may be used in some embodiments. The CMOS device 20 includes a substrate 200, isolation region 201 separating the NFET 202n from the PFET 202p in the substrate 200. Source regions 211, 213 and drain regions 212, 214 for the NFET and PFET 202n, 202p, respectively, are formed in the substrate 200. As will be discussed further below, a respective non-doped channel region 209n, 209p embedded in the substrate 200, positioned between the source regions 211, 213 and drain regions 212, 214 and drain regions 212, 214, is substantially coplanar with a top surface 200A of the substrate 200. An n well 203n and a p well 203p in the PFET 202p and NFET 202n, respectively, can be referred to the active region 103 previously discussed in FIG. 1.

In FIG. 2, a high-k dielectric layer 204 is between non-doped channel region 209n, 209p, and the N-metal gate 205n and P-metal gate 205p. Each of the source and drain region includes, from bottom to top, a funnel portion (211a, 212a, 213a, 214a), a belt portion (211b, 212b, 213b, 214b), and a raised portion (211c, 212c, 213c, 214c). The raised portion is the portion above the top surface 200A, and the belt portion is the portion immediately under the top surface 200A. The N-metal gate 205n and P-metal gate 205p are positioned over the non-doped channel region 209n, 209p, and over a portion of the belt portion (211b, 212b, 213b, 214b).

The high-k dielectric layer 204 may include silicon oxide, high-k dielectric material or combination thereof. A high-k dielectric material is defined as a dielectric material with a dielectric constant greater than that of $SiO_2$. The high-k dielectric layer includes metal oxide. The metal oxide is selected from the group consisting of oxides of Li, Be, Mg, Ca, Sr, Sc, Y, Zr, Hf, Al, La, Ce, Pr, Nd, Sm, Eu, Gd, Tb, Dv, Ho, Er, Tm, Yb, Lu and mixtures thereof. The high-k dielectric layer 204 may be grown by a thermal oxidation operation, a chemical vapor deposition (CVD) operation, an atomic layer deposition (ALD) operation, and may have a thickness less than 2 nm.

Figure 3:
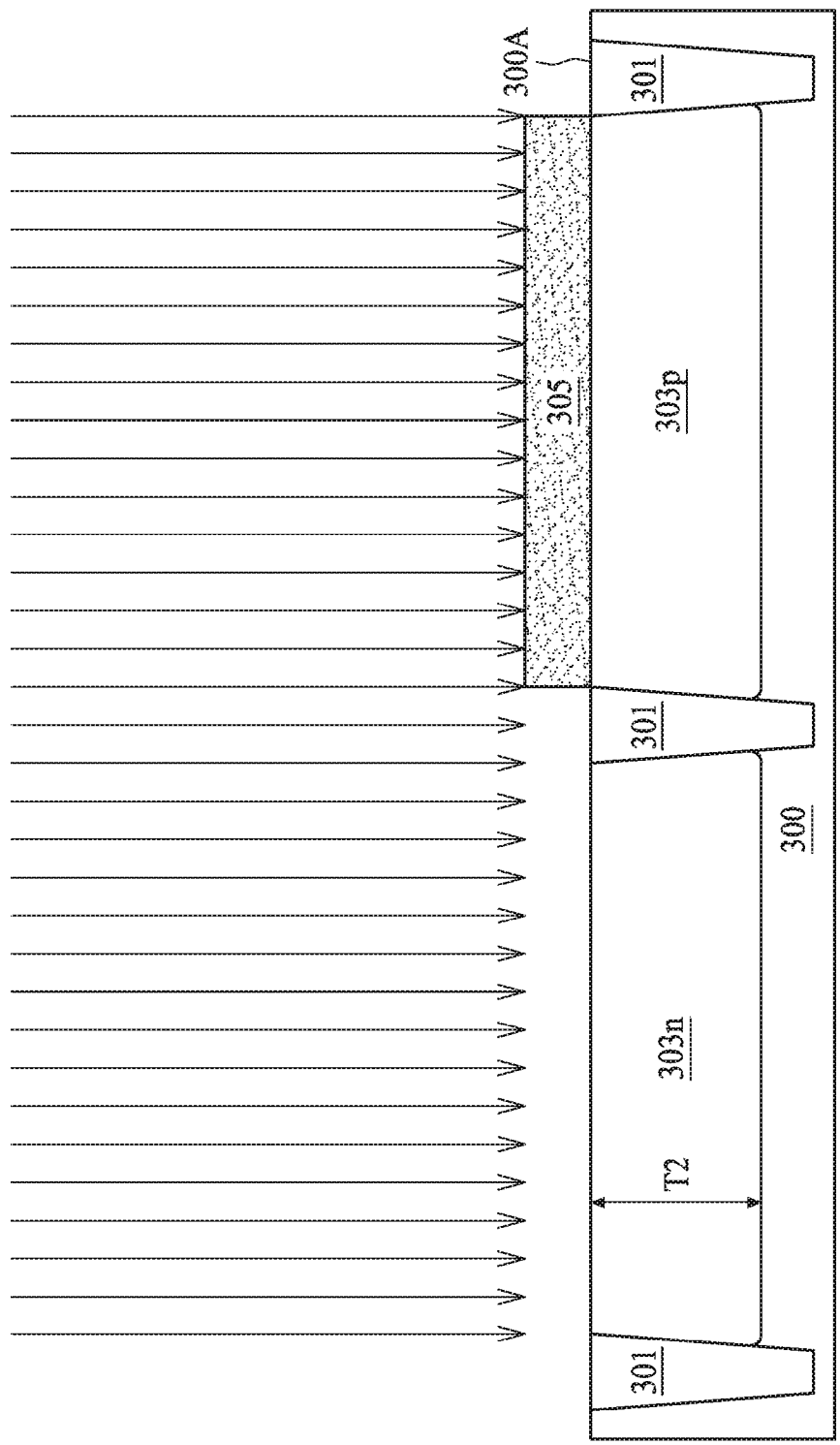
FIG. 3 to FIG. 15 are fragmental cross sectional view of a method for manufacturing a semiconductor structure, in accordance with some embodiments of the present disclosure.

FIGS. 3 to 15 are fragmental cross sectional view of a method for manufacturing a semiconductor structure. Referring to FIG. 3, isolation regions 301 are formed in a substrate 300, defining active regions surrounded by the isolation regions 301. In some embodiments, an n-well 303n implantation is performed when a p-well 303p is covered with a mask 306. Note the mask 306 is positioned on a top surface 300A of the substrate 300. The well implantation may be performed before the formation of any gate structure, and a predetermined thickness T2 of the n-well 303n or the p-well 303p is from about 50 nm to about 300 nm. In some embodiments, some dimples (not shown) are generated at a portion of the top surface 300A in proximity to the isolation regions 301 after the implantation operation.

Figure 4:
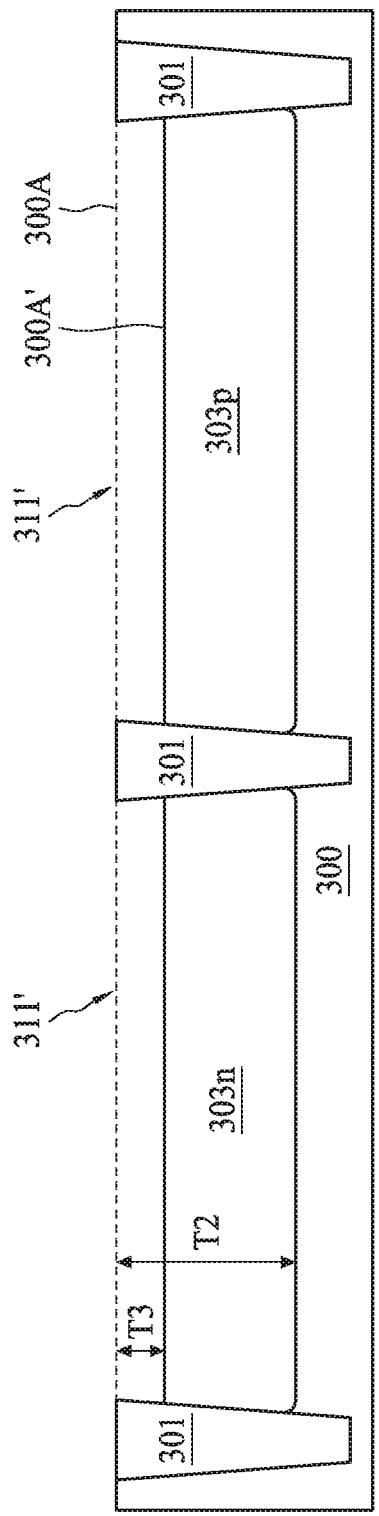

Referring to FIG. 4, a surface layer of the n-well 303n and the p-well 303p is removed (e.g., by reactive ion etching (RIE)), which forms recesses 311'. A thickness T3 of the recess 311' can be controlled to be smaller than 50 nm. As discussed previously, thickness T2 of the n-well 303n or the p-well 303p is about 10 to 20 times greater than thickness T3 of the recess 311'. Note that during the removal of the surface layer, no source or drain region is defined in the n-well 303n or the p-well 303p, and as shown in FIG. 4, at least one end of the recess 311' abuts the isolation regions 301. In some embodiments, both ends of the recess 311' abut the isolation regions 301. After the removal of the surface layer, the original top surface 300A is replaced by a recess bottom 300A'.

Figure 5:
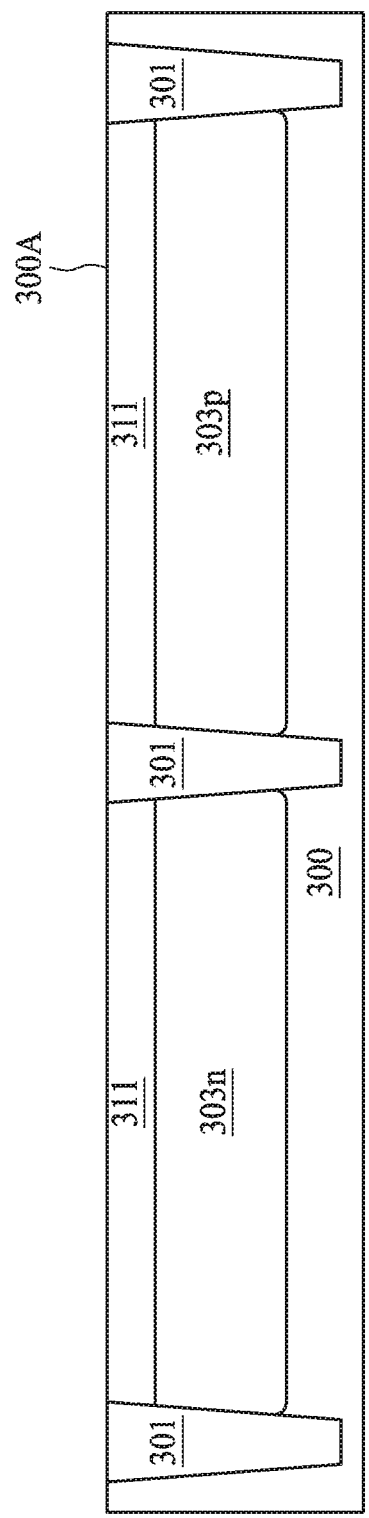

Referring to FIG. 5, a recessed regrown layer 311 is formed to fill the recess 311' discussed previously by a suitable deposition operation. In some embodiments, the recessed regrown layer 311 is epitaxially grown with no in-situ doping or post-grown implantation. In other words, the recessed regrown layer 311 is an epitaxially grown, non-doped layer. In some embodiments, the recessed regrown layer 311 can be composed of materials such as Si, SiC, SiN, SiON, SiGe, SiP, or the combinations thereof. A planarization operation, such as a chemical mechanical polishing, may be carried out to form a planar top surface 300A of the recessed regrown layer 311 after the deposition. In some embodiments, the planar top surface 300A is coplanar with a top surface of the isolation regions 301. No source or drain region is defined right upon the formation of the recessed regrown layer 311.

Figure 6:
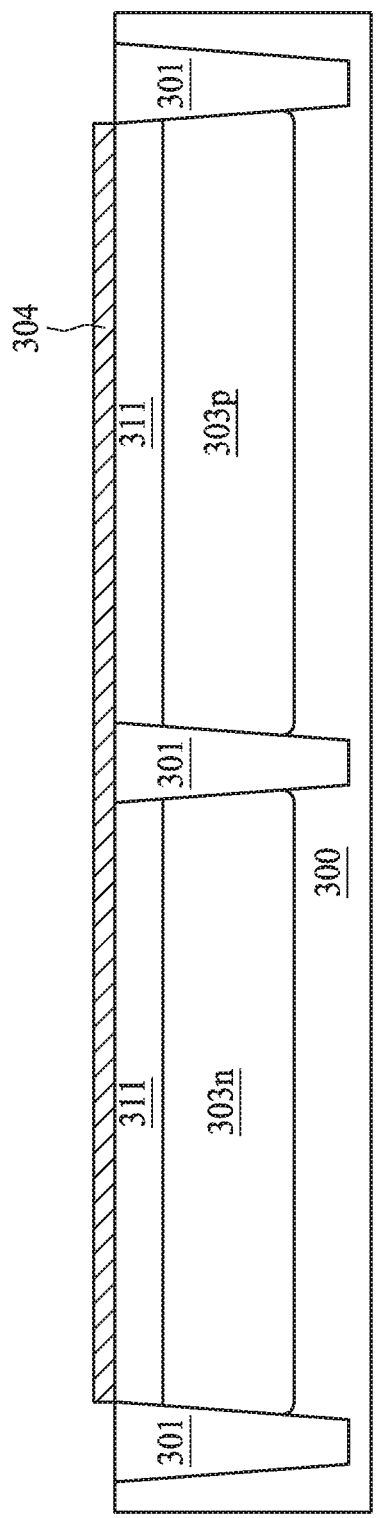

Referring to FIG. 6, a high-k dielectric layer 304 is formed over the recessed regrown layer 311. The operation regarding the high-k dielectric layer 304 formation is previously discussed in FIG. 2, and is not repeated here for simplicity. In addition, an interfacial layer (not shown) can be formed between the high-k dielectric layer 304 and the recessed regrown layer 311 in order to minimize stress therebetween. The interfacial layer may be formed of silicon oxide or silicon oxynitride grown by a thermal oxidation process. For example, the interfacial layer can be grown by a rapid thermal oxidation (RTO) process or in a conventional annealing process comprising oxygen.

Figure 7:
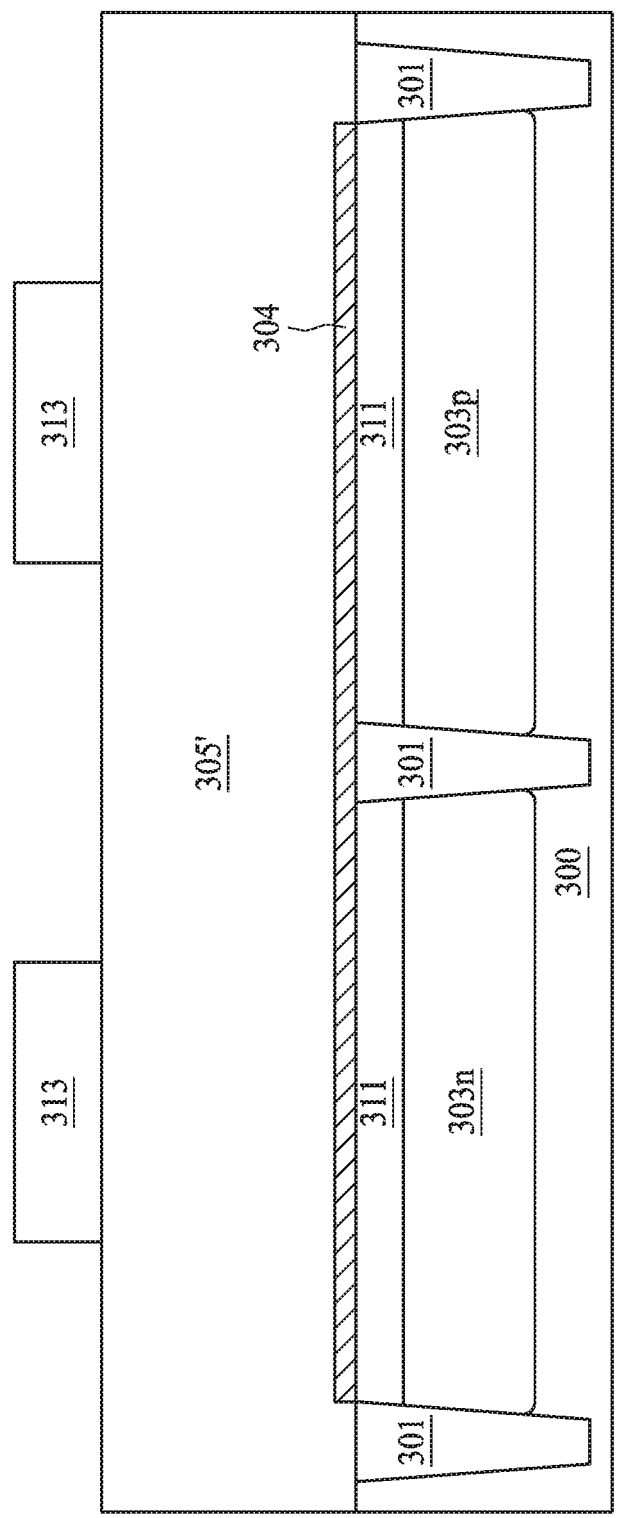
Figure 8:
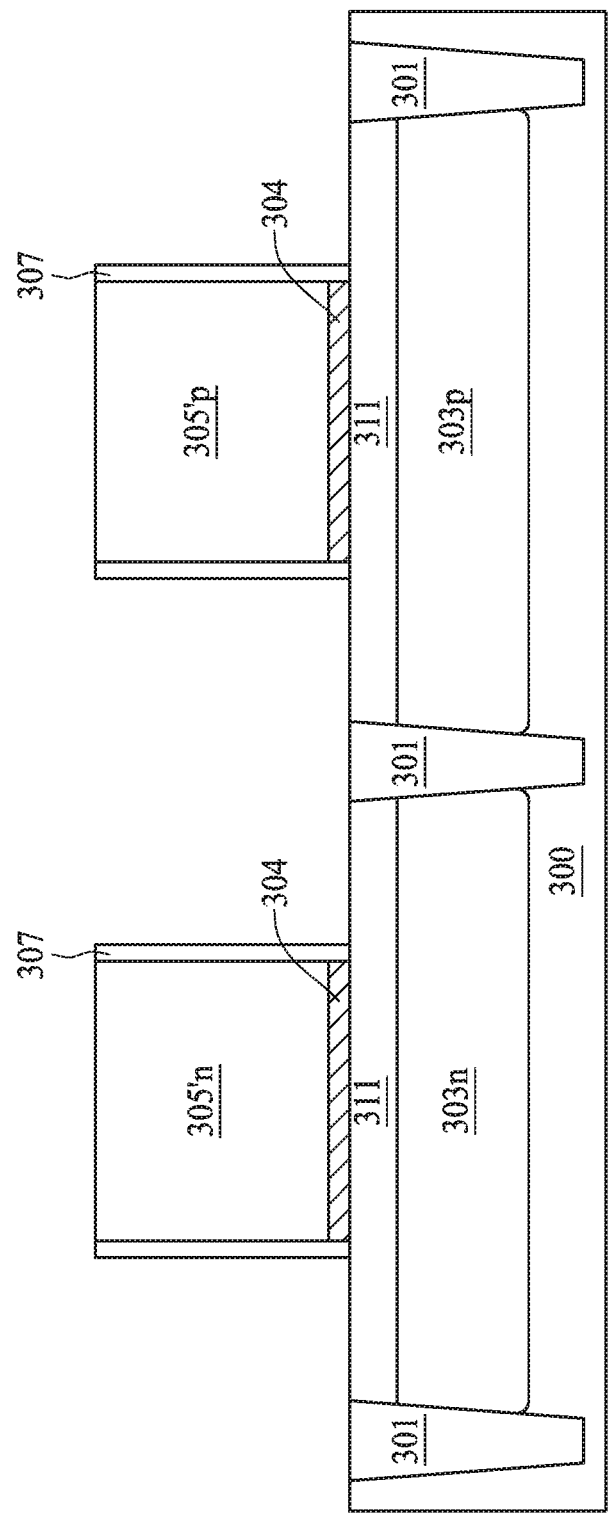

Referring to FIG. 7 and FIG. 8, a dummy gate electrode is formed over a middle portion of the recessed regrown layer 311. In some embodiments of a "gate last" operation, a dummy gate electrode layer 305' is subsequently formed over the high-k dielectric layer 304. In some embodiments, the dummy gate electrode layer 305' may include a single layer or multilayer structure. In the present embodiment, the dummy gate electrode layer 305' may include poly-silicon. Further, the dummy gate electrode layer 305' may be doped poly-silicon with uniform or gradient doping. The dummy gate electrode layer 305' may have a thickness in the range of from about 30 nm to about 60 nm. The dummy electrode layer 305' may be formed using a low-pressure chemical vapor deposition (LPCVD) process, subsequently, the dummy gate electrode layer 305' and high-k dielectric layer 304 are patterned to produce the structure shown in FIG. 8. In the depicted embodiment, a layer of photoresist 313 is formed over the dummy gate electrode layer 305' by a suitable process, such as spin-on coating, and patterned to form several patterned photoresist features over the dummy gate electrode layer 305' by a proper lithography patterning method. The plurality of patterned photoresist features can then be transferred using a dry etching process to the underlying layers (i.e., the dummy gate electrode 305' and the high-k dielectric layer 304) to form several dummy gate structures 305'$n$ and 305'$p$. The photoresist layer 313 may be stripped thereafter.

Referring to FIG. 8, a sidewall spacer 307 of the dummy gate structures 305'$n$ and 305'$p$ is formed after the dummy gate patterning operation. In some embodiments, a conformal spacer material is then deposited around the plurality of the dummy gate structures 305'$n$ and 305'$p$. In the present embodiment, the spacer material may include silicon nitride, silicon oxy-nitride, silicon carbide, or carbon-doped silicon nitride or other suitable material. The spacer material may comprise a single layer or multilayer structure. A blanket layer of the spacer material may be formed by CVD, ALD, physical vapor deposition (PVD), or other suitable technique. The blanket layer has a thickness ranging from about 5 to 15 nm. Then, an anisotropic etching is performed on the spacer material to form a pair of spacers 307 on sidewalls of each of the plurality of the dummy gate structures 305'$n$ and 305'$p$.

Figure 9:
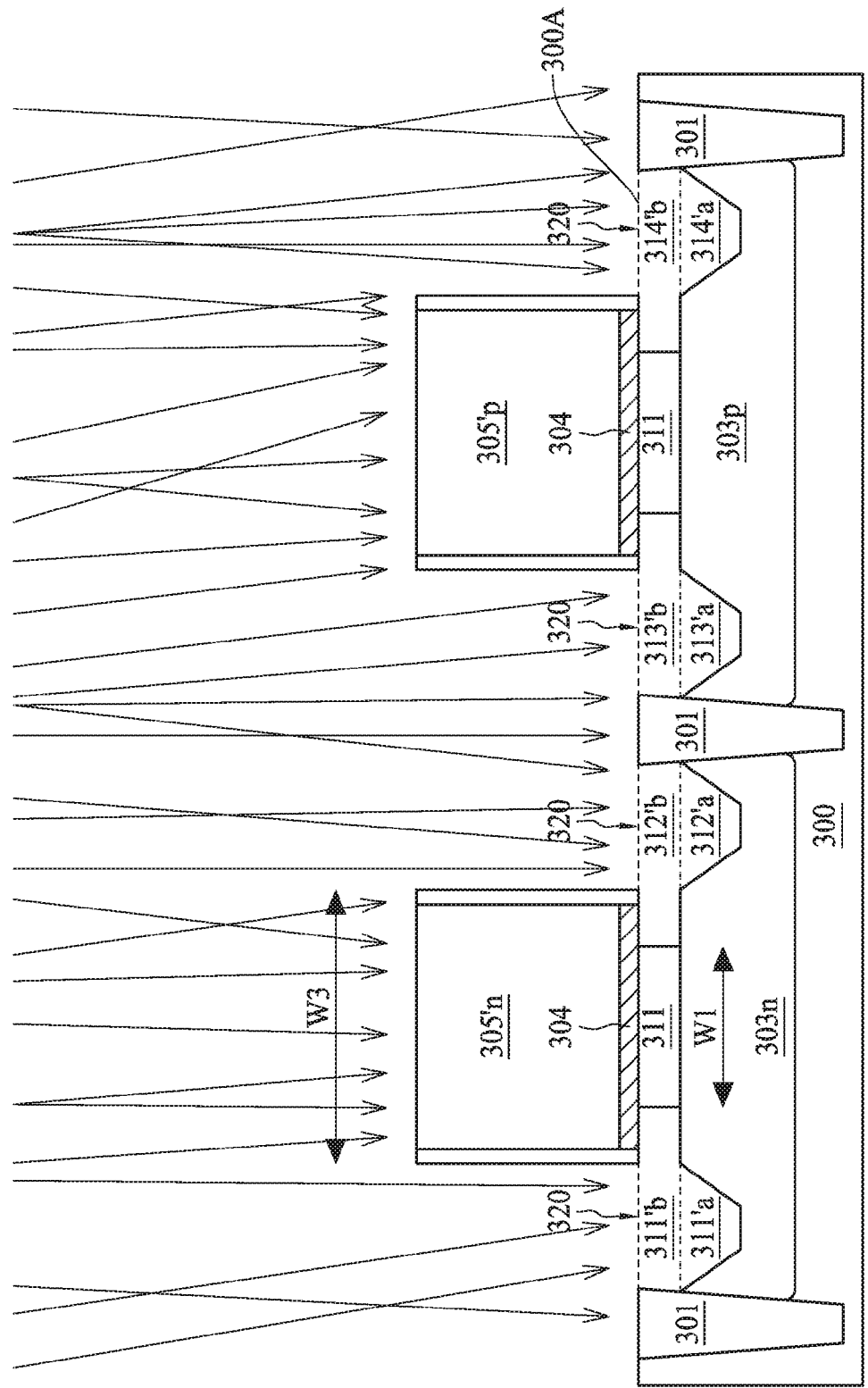
Figure 10:
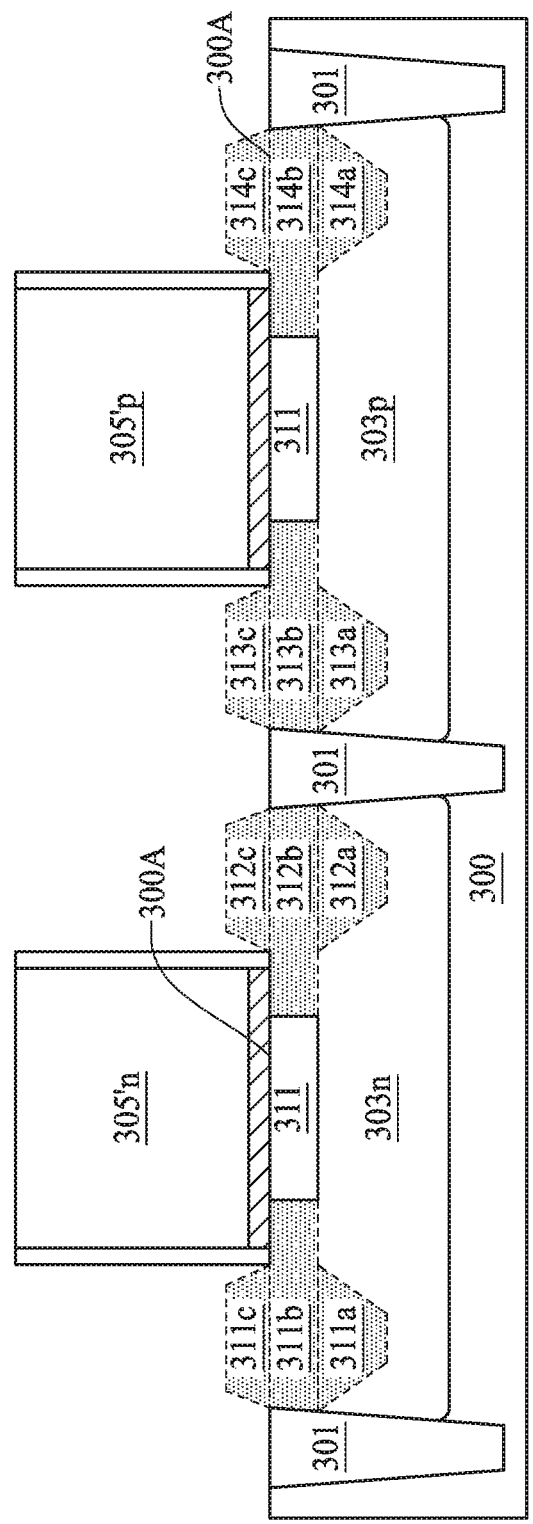

Referring to FIG. 9 and FIG. 10, a source region and a drain region (collectively a conductive region) are formed by performing a removal operation at a top surface 300A (dotted line in FIG. 9) and several recesses 320 are formed in the n-well 303$n$ and p-well 303$p$. In the formation of recesses 320, dummy gate structures 305'$n$ and 305'$p$ are used as etching masks. Note in FIG. 9, each of the recesses 320 possesses at least a belt portion (311'$b$, 312'$b$, 313'$b$, 314'$b$) which can be identified as a portion with greatest width in the recess 320. In some embodiments, because materials constituting the recessed regrown layer 311 and those constituting the wells 303$n$, 303$p$ can be different, a recess pattern shown in FIG. 9 can be obtained due to different lateral etching rates. A belt portion (311'$b$, 312'$b$, 313'$b$, 314'$b$) in the recess is stacked on top of a funnel portion (311'$a$, 312'$a$, 313'$a$, 314'$a$), and the recessed regrown layer 311 is laterally removed during the recess 320 formation operation to an extent that a width W1 of the remaining recessed regrown layer 311 is smaller than a width W3 of the dummy gate structures 305'$n$ and 305'$p$.

Referring to FIG. 10, an epitaxial growth operation is performed to fill the recesses 320, so as to form several conductive regions having a funnel portion (311$a$, 312$a$, 313$a$, 314$a$), a belt portion (311$b$, 312$b$, 313$b$, 314$b$), and a raised portion (311$c$, 312$c$, 313$c$, 314$c$). Note different facets can be observed in both the funnel portion and the raised portion, and the raised portion is referred to the portion above the top surface 300A of the recessed regrown layer 311. In some embodiments, silicon germanium (often referred to as SiGe stressors) is epitaxially grown in the recesses 320, for example, using Selective Epitaxy Growth (SEG). In some exemplary embodiments, SiGe stressors are formed using Plasma Enhanced Chemical Vapor Deposition (PECVD). The precursors include Si-containing gases and Ge-containing gases, such as $SiH_4$ and $GeH_4$, respectively.

During the epitaxy, the partial pressures of the Si-containing gases and Ge-containing gases are adjusted to modify the atomic ratio of germanium to silicon. The resulting SiGe stressors may have a germanium atomic percentage between about 10 atomic percent and about 50 atomic percent. In some embodiments, p-type impurities, such as boron and/or indium, are in-situ doped into SiGe stressors to a high concentration, which may be between about $10^{19}/cm^3$ and about $10^{21}/cm^3$, for example. In alternative embodiments, no p-type dopant is doped during the epitaxial growth of SiGe stressors. The top surface of SiGe stressors may be higher than the top surface 300A of substrate. SiGe stressors may include top portions and bottom portions that have different germanium percentages. For example, the germanium percentage of the top portions of SiGe stressors may be higher or lower than the germanium percentage of the lower portions of SiGe stressors.

Figure 11:
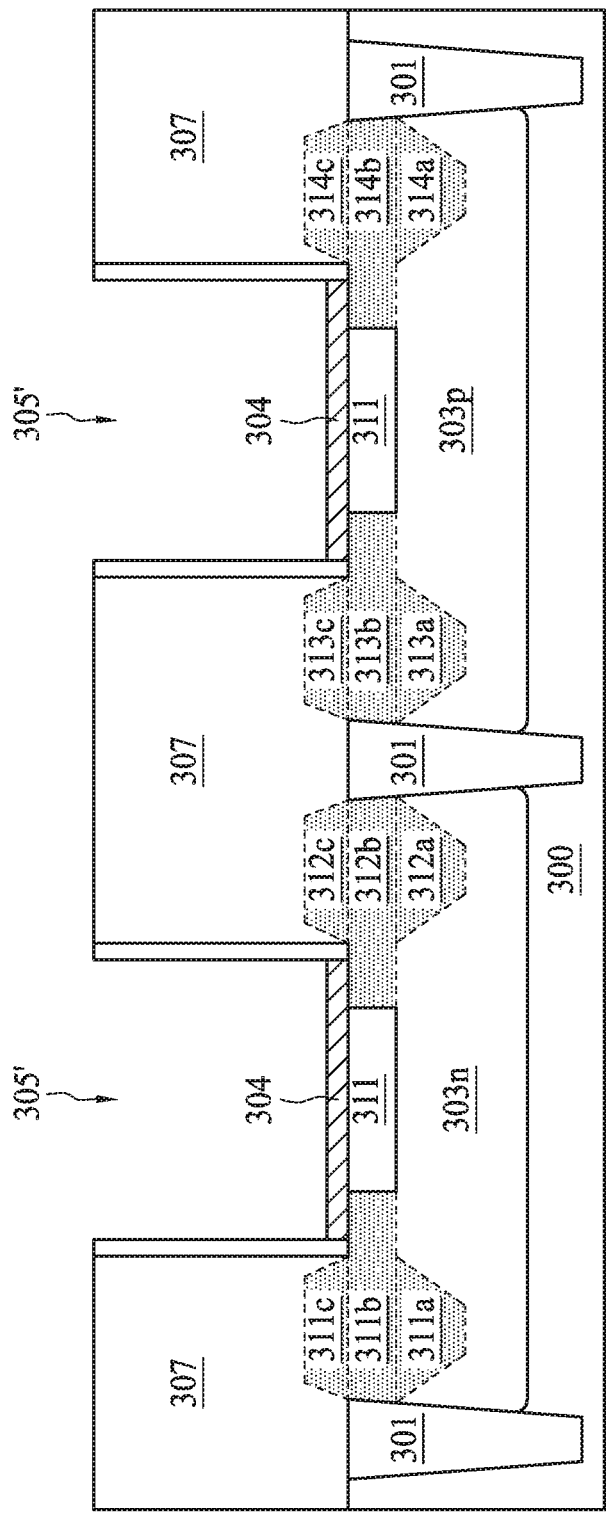
Figure 12:
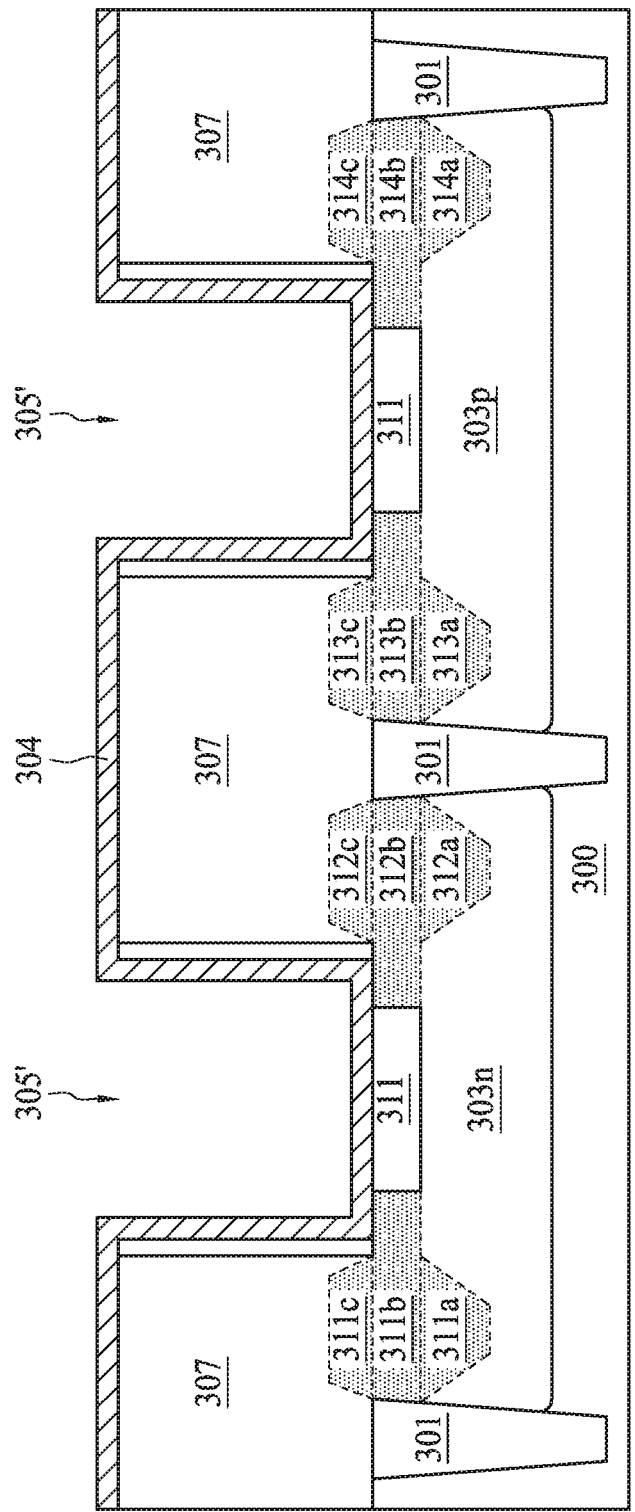

FIG. 11 to FIG. 15 show fragmental cross sectional views of metal gate (MG) formation operations. FIG. 11 and FIG. 12 are depictions of two different MG formation schemes—high-k first (FIG. 11) and high-k last (FIG. 12). Following FIG. 10, the dummy gate structure 305'$n$ and 305'$p$ is removed using wet etch and/or a dry etch operation. In at least one embodiment, the wet etch operation includes exposure to a hydroxide solution containing ammonium hydroxide, diluted HF, deionized water, and/or other suitable etchant solutions. In some embodiments, the dry etch operation may be performed under a source power of about 650 to 800 W, a bias power of about 100 to 120 W, and a pressure of about 60 to 200 mTorr, using $Cl_2$, HBr and He as etching gases. In FIG. 11, the high-k dielectric layer 304 is exposed only at the bottom of a gate trench 305', whereas in FIG. 12, the high-k dielectric layer 304 is subsequently and conformally deposited over the bottom and the sidewall of the gate trench 305', as well as a top surface of an interlayer dielectric layer (ILD) 307.

Figure 13:
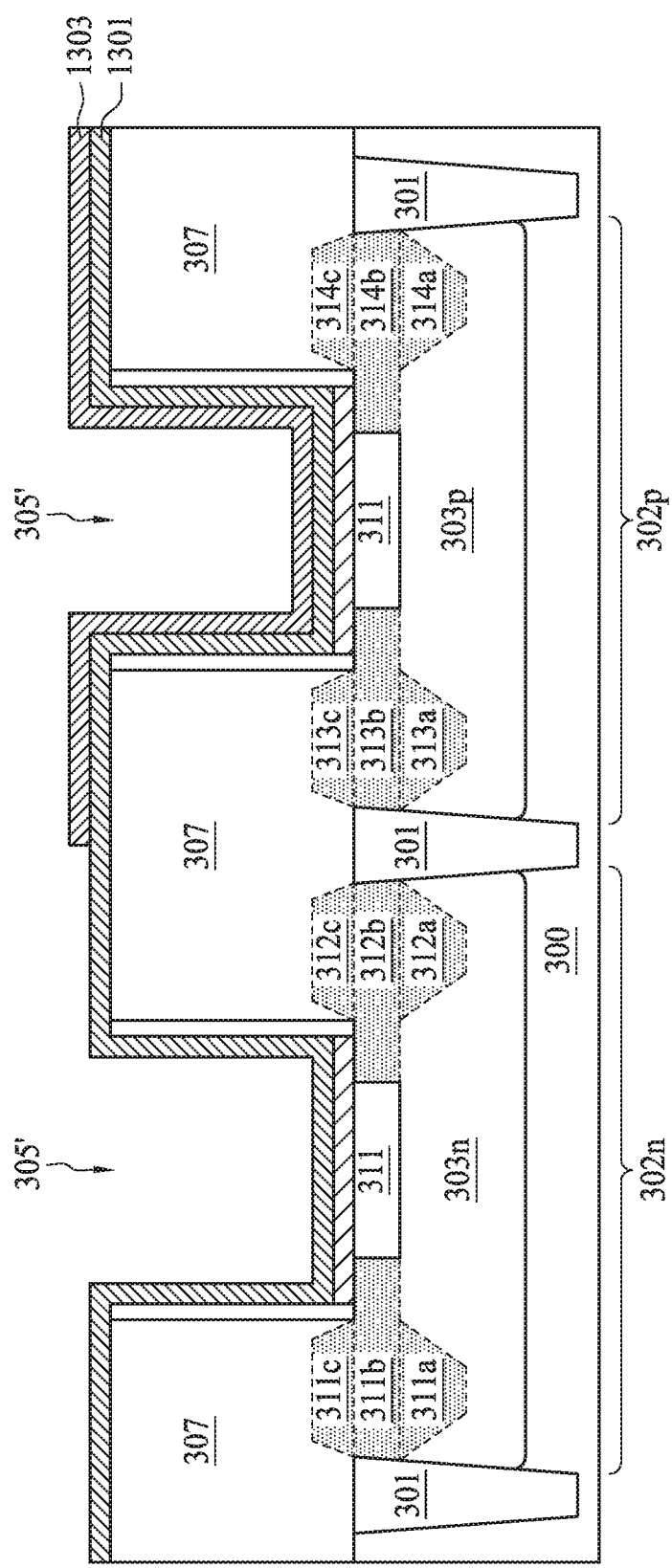
Figure 14:
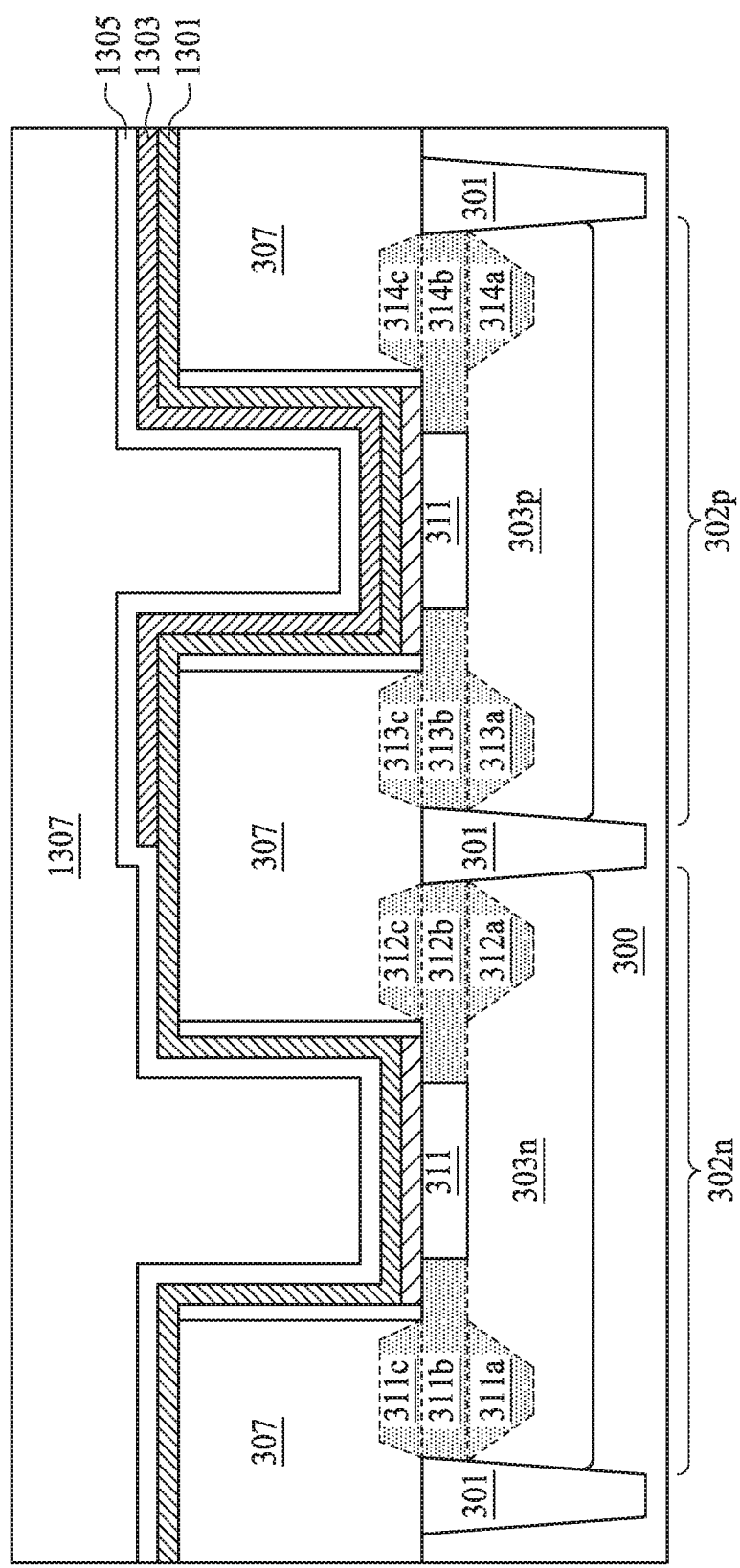

Referring to FIG. 13 and FIG. 14, after the formation of the gate trenches 305' over the recessed regrown layer 311 and a part of the belt portion (311'$b$, 312'$h$, 313'$h$, 314'$b$), a high-k cap layer or a barrier layer 1301 is conformally formed over the ILD and the gate trenches 305'. Subsequently, a P-work function metal layer 1303 fills in the trench 305' residing over the PFET 302$p$, while an N-work function metal layer 1305 fills both in the trench 305' residing over the NFET 302$n$ and the PFET 302$p$. Alternatively, the N-work function metal layer 1305 is filled only trench 305' residing over the NFET 302$n$. In some embodiments, the filled trenches may have a multi-layer structure such as a work function metal layer filled with a signal metal layer. Different work function metal layers are formed in the respective NFET and PFET, the processes require patterning a photoresist layer to protect regions of one type of device to form a metal gate in regions of the other type of device, and vice versa. Further, multiple work-function layers in a metal gate structure are generated as a result of reducing one patterning process.

Figure 15:
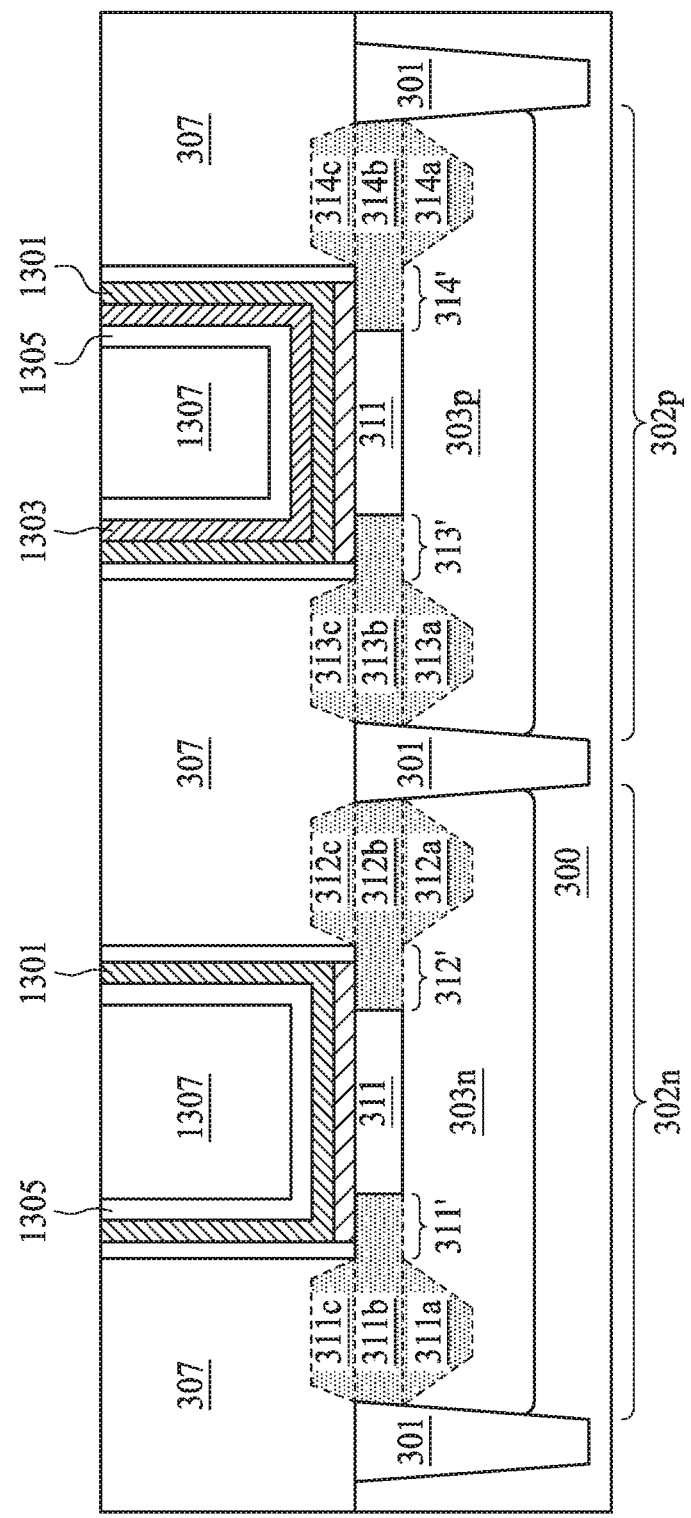

As shown in FIG. 14, a gate metal layer 1307 may then be formed overlying the N- or P-work function layers. The gate metal layer 1307 may include metal such as aluminum, tungsten, copper, and a planarization operation, such as a CMP, can be carried out to level the top surface of the MG, as shown in FIG. 15. Note the MG is positioned over the recessed regrown layer 311 and a plateau region (311', 312', 313', 314') of the belt portion (311$b$, 312$b$, 313$b$, 314$b$).

It will be appreciated that, as technology nodes continue to scale down, preventing short channel effects (SCE) and improving drain induced barrier lowing (DIBL) may be challenging for bulk devices. The above-described semiconductor structures and associated method advantageously provide the recessed regrown layer serving as a non-doped channel for improved SCE.

Some embodiments of the present disclosure provide a semiconductor structure, including a substrate having a top surface; a first doped region in proximity to the top surface; a non-doped region positioned in proximity to the top surface and adjacent to the first doped region, having a first width; a metal gate positioned over the non-doped region and over a portion of the first doped region, having a second width. The first width is smaller than the second width, and material constituting the non-doped region is different from material constituting the substrate.

In some embodiments of the present disclosure, the non-doped region is an epitaxial-grown region.

In some embodiments of the present disclosure, the semiconductor structure further includes a second doped region. A thickness measured from the top surface to a bottom of the second doped region is from about 10 to about 20 times of a thickness measured from the top surface to a bottom of the non-doped region.

In some embodiments of the present disclosure, material constituting the non-doped region includes Si, SiC, SiN, SiON, SiGe, SiP, or the combinations thereof.

In some embodiments of the present disclosure, the semiconductor structure further includes a high-K dielectric layer between the non-doped region and the metal gate.

In some embodiments of the present disclosure, the first width is approximate to a thickness measured from the top surface to a bottom of the non-doped region.

Some embodiments of the present disclosure provide a transistor structure, including a conductive region partially embedded in a substrate. The conductive region includes a raised portion over a top surface of the substrate and a belt portion under the top surface; a non-doped channel region between two adjacent conductive regions; a metal gate over the non-doped channel region and over a portion of the belt portion. The belt portion comprises a plateau region embedded in the substrate.

In some embodiments of the present disclosure, the plateau region abuts the non-doped channel region.

In some embodiments of the present disclosure, material constituting the conductive region being substantially identical to material constituting the non-doped channel region.

In some embodiments of the present disclosure, material constituting the non-doped channel region including Si, SiC, SiN, SiON, SiGe, SiP, or the combinations thereof.

In some embodiments of the present disclosure, material constituting the non-doped channel region being different from material constituting the substrate, a thickness of the non-doped channel region being from about 5 nm to about 50 nm.

In some embodiments of the present disclosure, the thickness of the non-doped channel region is substantially identical to a thickness of the belt portion.

In some embodiments of the present disclosure, the thickness of the non-doped channel region is substantially identical to a thickness of the belt portion.

In some embodiments of the present disclosure, the transistor structure further including a well region between the conductive region and the substrate.

In some embodiments of the present disclosure, a thickness of the well region ranges from about 50 nm to about 300 nm.

In some embodiments of the present disclosure, a width of the channel region is less than about 20 nm.

Some embodiments of the present disclosure provide a method for manufacturing a semiconductor structure, including defining a doped region in a substrate; forming a recessed regrown layer in the doped region; forming a conductive region by removing a portion of the recessed regrown layer and filling the recess with conductive materials; and forming a metal gate over a portion of the recessed regrown layer.

In some embodiments of the present disclosure, the forming the recessed regrown layer includes removing a surface layer of the doped region and forming a recess; and forming a non-doped regrown layer in the recess.

In some embodiments of the present disclosure, the forming the recess includes removing the surface layer for a thickness below 50 nm.

In some embodiments of the present disclosure, the forming the recess includes forming a recess abuts an isolation region defining a boundary of the doped region.

In some embodiments of the present disclosure, the forming the conductive region includes forming a recess having a belt portion below a top surface of the substrate; epitaxially filling the belt portion of the recess; and forming a raised portion over the top surface of the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:
   defining a doped region in a substrate;
   forming a recessed regrown layer in the doped region;
   forming a dummy gate over the recessed regrown layer;
   forming a conductive region by removing a portion of the recessed regrown layer to obtain a recess and filling the recess with conductive materials; and
   replacing the dummy gate with a metal gate over a portion of the recessed regrown layer.

2. The method of claim 1, wherein the forming the recessed regrown layer comprises:
   removing a surface layer of the doped region and forming a recess; and
   forming a non-doped regrown layer in the recess.

3. The method of claim 2, wherein the forming the recess comprises removing the surface layer for a thickness below 50 nm.

4. The method of claim 2, wherein the forming the recess comprises forming a recess that abuts an isolation region defining a boundary of the doped region.

5. The method of claim 1, wherein the forming the conductive region comprises:
   forming a recess having a belt portion below a top surface of the substrate;
   epitaxially filling the belt portion of the recess; and
   forming a raised portion over the top surface of the substrate.

6. The method of claim 5, further comprising:
forming the recess having a funnel portion below the belt portion; and
epitaxially filling the funnel portion of the recess.

7. The method of claim 1, further comprising:
forming a high-k dielectric layer over the recessed regrown layer before forming the conductive region.

8. The method of claim 7, wherein the removing the portion of the recessed regrown layer to obtain the recess exposes a bottom of the high-k dielectric layer.

9. The method of claim 1, further comprising:
forming a high-k dielectric layer over the recessed regrown layer after forming the conductive region.

10. A method for manufacturing a semiconductor structure, comprising:
defining a doped region in a substrate;
forming a recessed regrown layer in the doped region;
forming a high-k dielectric layer over the recessed regrown layer;
forming a dummy gate over the high-k dielectric layer;
laterally removing a portion of the recessed regrown layer to form a recess extending beneath the dummy gate by using the dummy gate as a hardmask, the recess exposing a bottom of the high-k dielectric layer; and
filling the recess with conductive materials.

11. The method of claim 10, wherein the recessed regrown layer is non-doped regrown layer.

12. The method of claim 10, wherein the recessed regrown layer comprises Si, SiC, SiN, SiON, SiGe, SiP, and the combinations thereof.

13. The method of claim 10, further comprising:
planarizing the recessed regrown layer before forming the dummy gate.

14. The method of claim 10, wherein the laterally removing a portion of the recessed regrown layer to form the recess further comprises:
forming the recess with a funnel portion and a belt portion over the funnel portion.

15. The method of claim 14, wherein the filling the recess with conductive material comprises:
filling conductive material in the funnel portion and the belt portion of the recess.

16. The method of claim 10, further comprising
forming a sidewall spacer over the dummy gate structure before laterally removing the portion of the recessed regrown layer.

17. A method for manufacturing a semiconductor structure, comprising:
defining a doped region in a substrate, the doped region extending to a surface of the substrate;
removing a layer in proximity to the surface of the substrate and forming a recess;
forming a non-doped regrown layer in the recess;
forming a conductive region by simultaneously etching a portion of the non-doped regrown layer and a portion of the doped region, wherein the non-doped regrown layer comprises a lateral etching rate greater than that of the doped region during the etching.

18. The method of claim 17, wherein the conductive region comprising comprises Si, SiC, SiN, SiON, SiGe, SiP, and the combinations thereof.

19. The method of claim 17, further comprising:
forming a dummy gate over the non-doped regrown layer before forming the conductive region.

20. The method of claim 17, father comprising:
forming a high-k dielectric layer over the non-doped regrown layer;
forming a dummy gate over the high-k dielectric layer;
wherein the etching the portion of the non-doped regrown layer comprises exposing a bottom of the high-k dielectric layer.

* * * * *